United States Patent [19]

Falckenberg et al.

[11] Patent Number: 4,871,517

[45] Date of Patent: Oct. 3, 1989

[54] APPARATUS FOR PARTING WAFER-SHAPED SILICON BODIES, USEFUL FOR SOLAR CELLS, FROM A SILICON TAPE MANUFACTURED IN A HORIZONTAL TAPE-DRAWING METHOD

[75] Inventors: Richard Falckenberg, Wald; Gerhard Hoyler, Munich; Josef Grabmaier, Berg, all of Fed. Rep. of Germany

[73] Assignee: Siemens Aktiengesellschaft, Berlin and Munich, Fed. Rep. of Germany

[21] Appl. No.: 251,970

[22] Filed: Sep. 26, 1988

Related U.S. Application Data

[63] Continuation of Ser. No. 49,823, May 15, 1987, abandoned.

[30] Foreign Application Priority Data

Jun. 6, 1986 [DE]   Fed. Rep. of Germany ....... 3619018

[51] Int. Cl.⁴ .............................................. B01D 9/00
[52] U.S. Cl. ........................... 422/248; 156/DIG. 84; 156/DIG. 88; 156/620.4; 156/620.71
[58] Field of Search ............... 156/DIG. 84, DIG. 88, 156/617 H, 619; 422/248

[56] References Cited

U.S. PATENT DOCUMENTS

| | | | |
|---|---|---|---|
| 4,305,776 | 12/1981 | Grabmaier | 156/605 |
| 4,319,953 | 3/1982 | Grabmaier | 156/622 |
| 4,329,195 | 5/1982 | Kudo | 156/DIG. 97 |
| 4,554,203 | 11/1985 | Grabmaier et al. | 427/86 |
| 4,563,976 | 1/1986 | Foell et al. | 156/617 H |
| 4,563,979 | 1/1986 | Falckenberg | 156/617 H |
| 4,664,745 | 5/1987 | Falckenberg et al. | 156/617 H |

*Primary Examiner*—William R. Dixon, Jr.
*Assistant Examiner*—Anthony J. Green
*Attorney, Agent, or Firm*—Hill, Van Santen, Steadman & Simpson

[57] ABSTRACT

A method and apparatus for producing disk-shaped or wafer-shaped silicon bodies from a silicon tape produced in a horizontal tape-drawing process, utilizing a woven fabric of graphite threads as a carrier for the silicon to be crystallized. The crystallization of the molten silicon is initiated by heating sources positioned about the melt crucible. Radiation losses are reduced by providing shielding members in predetermined, prescribed intervals corresponding to the areas at which the parting lines are to be provided in the tape. The shielding members reduce the radiation losses to such an extent that a readily frangible line is produced in the area of the shielding members enabling the tape to be broken up at regular, predetermined intervals on a continuous basis.

10 Claims, 1 Drawing Sheet

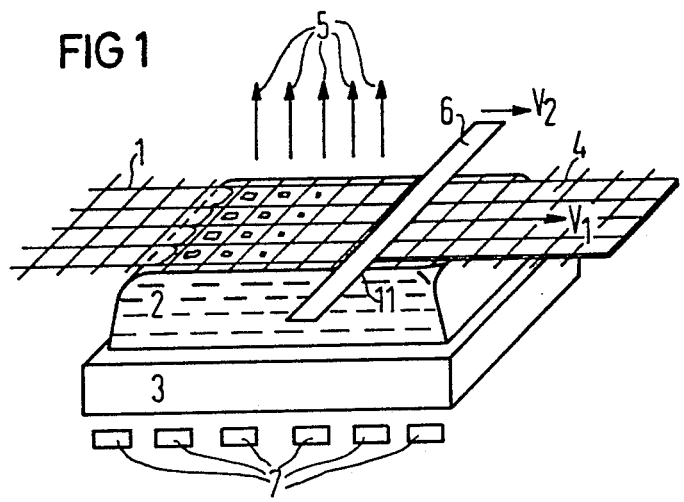
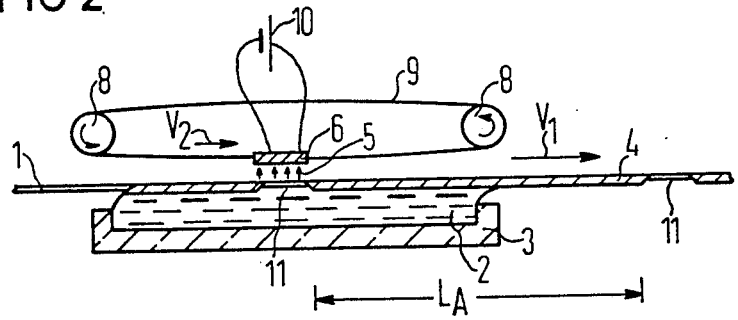
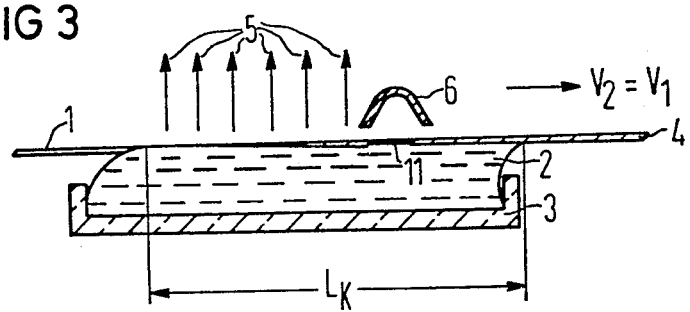

APPARATUS FOR PARTING WAFER-SHAPED SILICON BODIES, USEFUL FOR SOLAR CELLS, FROM A SILICON TAPE MANUFACTURED IN A HORIZONTAL TAPE-DRAWING METHOD

This is a continuation of application Ser. No. 49,823, abandoned, filed May 15, 1987.

BACKGROUND OF THE INVENTION

Field of the Invention

The present invention is in the field of making disk-shaped or wafer-shaped silicon bodies which can be used for solar cells on a continuous basis.

In the so called horizontal tape-drawing process for producing a silicon tape, a woven fabric preferably composed of graphite threads is employed as a carrier member and as a nucleator for crystallization. This fabric is drawn across a molten silicon bath in a tangential direction with heating sources are controlled such that considering the radiant losses of the melt surface, the silicon tape solidifies in a uniform thickness before it is drawn laterally from the melt. Such a procedure is disclosed, for example, by European Patent Application No. 0170119, corresponding to U.S. Ser. No. 755,587, now U.S. Pat. No. 4,664,745, whose disclosure is hereby incorporated by reference. Silicon tapes are thereby continuously manufactured with high drawing rates on the order of meters per minute. The silicon tapes are then divided into appropriate sections before further processing into solar cells.

In order not to disturb the continuity of the drawing process, the severing into sections of defined length must occur during the drawing process and with a constant drawing rate. The severing process must not place the tape under shock or under vibration because the growth process would thereby be disturbed. Growth disturbances lead to a reduction in the efficiency of the solar cells manufactured from this material.

SUMMARY OF THE INVENTION

The present invention provides a method for severing continuously pulled silicon ribbons which is free of disruptions and which can be used in conjunction with a continuous manufacturing process without restraint.

In the method of the present invention, this objective is achieved by controlling the radiant losses at the melt surface and reducing them by entrained shielding members which are located in predetermined, prescribed spacings corresponding to the size of the silicon tape sections for the solar cells. The losses are reduced to such a degree that a solidification does not occur in limited areas of the tape, and a frangible parting strip is thereby formed in the silicon tape.

In accordance with the present invention, bridge-shaped structures of heat resistant material having good electrical current conductivity are employed as a shielding member, the members being located on the outer strips of the graphite fabric which are not employed for crystallization and thus span the surface of the melt. The shielding members are heatable by passage of electric current there through and the shielding members may be composed of graphite or molybdenum. The shielding members should be composed of a material exhibiting a high absorption factor and having low thermal capacitance with respect to their shape. For example, the shielding members may be thin graphite lamellae or graphite fabric strips in either case being heat insulated at one side with a graphite felt. The shielding members preferably have a high degree of reflectivity. In a preferred form of the invention, the shielding members have a parabolic cross-section.

An apparatus which may be used to perform the method of the present invention includes a melting crucible in which the silicon is melted. The refractory fabric especially the graphite fabric is pulled across the surface of the melt by means of a drive means located outside the melting crucible region and inclined at angles less than 10° relative to the horizontal. A deflection roller is positioned laterally above the melting crucible for supporting the woven graphite band which provides the nucleation center. A reservoir is provided in proximity to the melt crucible and precedes the actual drawing device. Reflectors are arranged above the melting crucible which are controllable with respect to their position relative to the melt surface. The aforementioned drive devices and deflection rollers are arranged outside of the region of the melt crucible such that the deflection rollers move a tape carrying the shielding members, the tape being synchronized with the carrier member to be coated so that they proceed at the same velocity.

A plurality of shielding members may be used which are spaced by the interval required in the silicon wafers. A fork shaped device may be used to lift the shielding members from the tape after passage through the crystallization zone.

BRIEF DESCRIPTION OF THE DRAWINGS

The invention will be set forth in greater detail with reference to several exemplary embodiments and to FIGS. 1 thru 3 wherein the same reference numerals have been used for elements having the same function and in which:

FIG. 1 is a view in perspective for explaining the principles of the invention;

FIG. 2 is a schematic illustration of one form of apparatus which can be used to practice the method of the present invention; and FIG. 3 is a schematic form of still another form of apparatus useful for the purposes of the present invention.

DESCRIPTION OF THE PREFERRED EMBODIMENTS

The following concepts underlie the improvements of the present invention. In the horizontal tape-drawing process a silicon tape is produced from a surface of a silicon melt which is cooled and solidifies to form a thin layer. With suitable management of this solidification process, the layer can be continuously drawn off laterally from the melt in the form of a tape. In order to stabilize the crystallization process, a material exhibiting an emission coefficient E which is higher than that of the silicon melt is employed as a carrier member and may constitute, for example, a network of carbon fibers. The cooling required for solidification of the silicon surfaces essentially occurs by radiation.

In accordance with the present invention, the radiation losses of the melt surface are reduced at certain intervals which correspond to the size of the desired silicon tape sections, being reduced to such a degree that a solidification no longer occurs. This is achieved by moving a shielding member along with the silicon tape being formed, the shielding member preventing the heat emission from the melt surface required for solidification. In principle, there are four properties of the entrained member which can be exploited, namely:
1. the characteristic temperature,
2. the emission of absorption degree $E_K$,
3. the reflectivity and
4. the shape.

The power P per surface unit radiated from the melt is calculated by:

$$P = \frac{E_S \cdot E_K}{E_S + E_K - E_S \cdot E_K} \sigma(T_S^4 - T_K^4)$$

This proceeds in accordance with a Stefan-Boltzmann law, wherein $E_S$ is the emission capability of the melt, $E_K$ is the emission capability of the covering member K, sigma is the Stefan-Boltzmann constant, $T_S$ is the temperature of the melt, and $T_K$ is the temperature of the covering member.

When $E_S$ in the equation is replaced by the emission coefficient of the solid silicon $E_F$, there is obtained the power emitted from the crystallized surface. With a non-covered surface, the emitted power of the solid silicon is roughly 7 watts/cm$^2$ higher than that of the molten silicon at the melting temperature $T_S$.

In the case of an unaltered heating power $P_H$, the crystallization is initiated by contacting the melt surface with a network of carbon fibers moved in the horizontal direction, the radiated power P increased by about 7 watts/cm$^2$. As far as this quantity does not lead to a reduction in temperature it is supplied by the latent heat $P_L$ being released:

$$P = P_H + P_L.$$

Assuming the heating capacity $P_H$ to be constant, $P_L$ is equal to or less than 7 watts/cm$^2$. If the loss by radiation of the portion $P_L$ obtained from the latent heat is prevented, then a crystallization cannot longer occur.

Referring to the drawings, in FIG. 1 there is shown a network of carbon fibers 1 moving horizontally at a velocity $v_1$. A silicon melt 2 is confined within a crucible 3 composed of quartz or the like. Contacting of the network of fibers 1 with the surface of the melt produces a crystallized silicon tape 4 moving at a velocity $V_1$. Reference 5 indicates schematically the radiation of the heat coming from the melt or from the crystallized surface resp. A shielding member 6 composed, for example, of a strip-shaped molybdenum sheet is provided and moves with the velocity $v_2$. A heater 7 which may be located both above and below the melt provides the appropriate temperature to the molten silicon in the crucible 3. Reference 11 identifies the parting location between the individual sections of the silicon tape.

In the arrangements shown, $v_1$ is equal to $v_2$, with the arrows indicating the drawing direction.

FIG. 2 shows a schematic illustration of a continuously operating arrangement wherein the shielding member 6 takes the form of a strip-shaped graphite member for carrying out the inventive idea. The graphite shielding members 6 are moved with a rate $v_2$ together with the graphite carrier member 1 to be coated, the two being moved synchronously on a tape 9 between deflection rollers 8 by means of an additional gearing (not shown). The graphite shielding member 6 is heated up to a temperature $T_K$ by means of a current source 10. At the temperature $T_K$, the characteristic emission of the shielding member 6 onto the silicon lying below it is so high that a crystallization of the melt 2 at the location 11 is not possible. The location 11 thus becomes the parting location.

The thermal radiation 5 rising from the silicon melt 2 can also be used directly for heating the shielding member 6. The member 6 must then be distinguished by high absorption factor E and must be such that its thermal capacity is low and thermal losses are prevented at that side of the member 6 which faces away from the melt. Thin graphite lamellae or strips of graphite fabric which are thermally insulated on one side with graphite felt can be employed in practice. The indicated spacing $L_A$ in FIG. 2 refers to the section length, i.e., the length of the disk shape or wafer shaped silicon member to be severed.

In FIG. 3 there is shown shielding members 6 composed of high reflectivity material such as molybdenum sheets being used as shielding members. These sheets usually do not require any heating. The shielding members 6 have cross sections which are preferably in the shape of a parabola. In this way, the reflected radiation 5 is concentrated onto the focal line and a silicon tape 4 having especially narrow parting lines 11 is obtained.

The effect of the reflection can decrease with continued use of the shielding member 6 where upon their surfaces may be vapor deposited silicon. This deposited silicon layer can be removed after each pass, for example, by means of plasma etching.

An additional effect of the shielding members 6 arises when the work is not carried out in a vacuum but in a protective gas atmosphere. The convection stream contributing to the cooling of the silicon surface is diminished by the shielding member 6 or with the parabolic form shown in FIG. 3 it is largely supressed.

As previously mentioned, the shielding member 6 should be synchronously moved together with the crystallizing band, i.e., $v_1$ equals $v_2$. The shielding member 6 may be fashioned as bridges which are put in place on the outside strips of the carbon fiber network 1 which are not used for crystallization, so that the bridges span the melt 2. After traversing the crystallization zone, they are lifted from the coated carrier member 4 with the assistance of a fork like apparatus and are conveyed back into their initial position.

When the section length $L_A$ in FIG. 2 is shorter than the crystallization length $L_K$ referred to in FIG. 3, then a plurality of shielding members 6 is simultaneously used, being synchronously moved together with the silicon tape 4.

It should be evident that various modifications can be made to the described embodiments without departing from the scope of the present invention.

We claim as our invention:
1. An apparatus for forming a continuous silicon tape with spaced dividing lines which comprises:
   a heated crucible containing a bath of molten silicon therein,
   a refractory fabric,
   means for drawing said refractory fabric tangentially across said bath to crystallize molten silicon therefrom,
   at least one reflector positioned above said bath and,
   means for driving said reflector in synchronism with the movement of said fabric.
2. An apparatus according to claim 1 which includes:
   a plurality of reflector means driven in synchronism with the movement of said fabric and spaced apart by a predetermined distance equal to the spacing between said dividing lines.

3. The apparatus of claim 2 wherein said reflector is composed of electrically conductive, heat resistant material extending beyond the lateral edges of said fabric and spanning the surface of said melt.

4. The apparatus of claim 1 wherein said reflector includes an electrically heated strip of molybdenum, or graphite.

5. The apparatus of claim 1 wherein said reflector has a high reflectivity.

6. The apparatus of claim 1 wherein said reflector has parabolic cross-section.

7. An apparatus for forming severable sections of silicon in a horizontal tape drawing process wherein a carbon fiber fabric is drawn tangentially across a bath of molten silicon while heating the bath under conditions sufficient to form a silicon tape of uniform thickness on the fabric comprising:

a heated crucible for containing a bath of molten silicon;

means for drawing the carbon fiber fabric tangentially across the bath to crystallize molten silicon therefrom;

shielding members, in spaced positions along the path of travel of the carbon fiber fabric, the shielding members corresponding to a size of the severable sections; and means for moving the shielding members in unison with the tape, to reduce radiation losses from the upper surface of the bath, inhibiting solidification in spaced, limited portions of the tape and forming readily frangible boundaries with the sections.

8. The apparatus of claim 7 wherein the shielding members are composed of electrically conductive, heat resistant material extending beyond the lateral edges of the fabric and spanning the surface of the melt.

9. The apparatus of claim 7 wherein the shielding members have a high reflectivity.

10. The apparatus of claim 7 wherein the shielding members have parabolic cross-sections.

* * * * *